United States Patent [19]
Dearnaley

[11] Patent Number: 5,512,330
[45] Date of Patent: Apr. 30, 1996

[54] PARYLENE PRECURSORS FOR DIAMOND-LIKE CARBON COATINGS

[76] Inventor: Geoffrey Dearnaley, 19826 Wittenburg, San Antonio, Tex. 78256

[21] Appl. No.: 317,896

[22] Filed: Oct. 4, 1994

[51] Int. Cl.[6] .............................. C23C 14/12; B05D 3/06
[52] U.S. Cl. ..................... 427/525; 427/533; 427/553; 427/249; 427/122; 427/255.7; 427/327
[58] Field of Search .................................. 427/525, 249, 427/122, 533, 553, 255.7, 327; 423/446

[56] References Cited

U.S. PATENT DOCUMENTS

| | | | |
|---|---|---|---|
| 4,844,785 | 7/1989 | Kitabatake et al. | 204/192.11 |
| 4,981,671 | 1/1991 | Moriyoshi et al. | |
| 5,055,318 | 10/1991 | Deutchman et al. | 427/534 |
| 5,064,682 | 11/1991 | Kiyama et al. | 427/523 |
| 5,393,572 | 2/1995 | Dearnaley | 427/523 |

FOREIGN PATENT DOCUMENTS 2122224  6/1986  United Kingdom .

OTHER PUBLICATIONS

"Parylene and Nova Tran Parylene Coating Services, for Unmatched Conformal Coating Performance, Specialty Coating Systems", 1992, Union Carbide Co., pp. 1–6.

"Parylene, A Biostable Coating for Medical Applications, Specialty Coating Systems", 1993, Union Carbide Co., pp. 1–5.

L. You et al., *Texture of vapor deposited parylene thin films*, Appl. Phys. Lett. 64, 2812–2814, May 1994.

*Xylylene Polymers*, Encyclopedia of Polymer Science and Engineering, vol. 17, 2nd edt. 1989 pp. 990–1024.

Roger Olson, *Parylene, a Biostable Coating for Medical Applications*, Specialty Coating Systems 1993, Union Carbide Co. pp. 1–5.

*Primary Examiner*—Roy V. King
*Attorney, Agent, or Firm*—Rosenblatt & Redano

[57] ABSTRACT

The present invention provides a new class of precursors for forming an improved diamond-like carbon coating on a workpiece. The precursors of the present invention are paraxylylenes, preferably dimers of paraxylylene, which are solid at room temperature and which will vaporize, pyrolize to substantially monomeric form, condense onto a workpiece, and spontaneously polymerize to form a "parylene" film which is free of precursor droplets and absorbed water. Upon bombardment with an ion beam, the parylene film is converted into a uniform, pinhole-free DLC coating.

22 Claims, No Drawings

PARYLENE PRECURSORS FOR DIAMOND-LIKE CARBON COATINGS

FIELD OF THE INVENTION

The present invention relates to a method and precursor composition for forming a diamond-like carbon ("DLC") coating on a workpiece using an ion beam-assisted method. More particularly, the present invention relates to the use of a paraxylylene precursor in an ion beam-assisted method to form an improved DLC coating.

BACKGROUND OF THE INVENTION

Ion beam-assisted methods for depositing DLC coatings are well known. Typically, such methods take place in a vacuum and involve first volatilizing a fluid hydrocarbon precursor, such as polyphenyl ether, and then condensing the volatilized precursor onto the surface of a workpiece while simultaneously subjecting the surface to energetic ion bombardment. The ion bombardment ruptures the carbon-hydrogen bonds in the precursor film, allowing the hydrogen to be pumped away, leaving the workpiece coated with a hard residual DLC coating.

Unfortunately, when a fluid precursor is heated in a vacuum, the fluid precursor sometimes spatters, causing droplets of precursor material to form on the surface of the workpiece. These droplets can prevent the energetic ion beam from adequately penetrating the precursor material, thereby preventing full conversion of the precursor droplet into DLC. Also, many fluid precursors tend to absorb water vapor if they are exposed to the atmosphere. Upon vaporization of the precursor, the absorbed water vapor is released as steam. The release of steam can lead to irregular vaporization of the precursor and can create droplets on the workpiece due to the sudden local release of water vapor from the precursor material. The result can be an unacceptable coating, the most common problem being the presence of pinholes which can cause erosion of the DLC coating and, eventually, corrosion of the substrate.

One way to overcome the foregoing problems might be to use a different type of precursor for the DLC coating. Any DLC precursor should have a low vapor pressure so that the precursor will condense to form a film that will not volatilize before it is converted to DLC. Preferably, the precursor material can be vaporized at a relatively low temperature. Also, the precursor preferably should not deleteriously decompose during vaporization.

Several materials besides polyphenyl ether have been used as precursors for ion-assisted deposition of DLC. Unfortunately, the current alternates to polyphenyl ether, such as poly dimethyl siloxane, are liquid and therefore have the same problem of droplet formation and water absorption as polyphenyl ether. A DLC precursor that does not present these problems would be highly desirable.

SUMMARY OF THE INVENTION

The present invention provides a new class of DLC precursors that avoid the problem of droplet formation and absorption of water vapor. The precursors of the present invention are derivatives of paraxylylene which are solid at room temperature and which vaporize and condense onto a workpiece to form a "parylene" film. The precursors preferably never pass through a liquid phase. Preferable precursors are paraxylylene dimers, which volatilize easily and, upon heating, disassociate into monomeric paraxylylene. In a preferred method, a solid paraxylylene dimer is vaporized in a chamber that is evacuated to a pressure of at least about $10^{-6}$ torr. The solid dimer is heated to a temperature between about 130°–220° C., preferably about 200° C., to form a vapor and the vapor is passed through a heated tube for a time and at a temperature sufficient to disassociate the dimer into its monomeric form. The substantially monomeric vapor is directed into a deposition chamber maintained at ambient temperature and maintained at about $10^{-4}$ to $10^{-5}$ torr, preferably by differential pumping. In the deposition chamber, the vapor condenses onto the workpiece to form a parylene film which is substantially even, continuous, and free of droplets and absorbed water. Upon bombardment with an ion beam, the parylene film is converted into a substantially uniform, pinhole-free DLC coating.

DETAILED DESCRIPTION OF THE INVENTION

The present invention can be used to form a DLC coating on substantially any suitable substrate. Preferred substrates include metal and ceramic components. A DLC coating is particularly desirable where the components will be subject to friction during use, e.g., metal or ceramic components of orthopaedic implants.

Before beginning the coating process, the substrate should be cleaned using conventional methods to remove superficial contaminants, such as grease. The substrate or workpiece preferably should be placed in a vacuum chamber at a base pressure of preferably less than about $10^{-5}$ torr and sputter cleaned by bombardment with ions, preferably argon ions, at an energy range between about 10–100 keV, preferably around 10 keV. This ion bombardment effectively removes some of the remaining adsorbed atoms from the surface of the workpiece.

If the substrate is metal or a metal alloy, a preferable procedure involves forming an intermediate layer at the surface of the metal to enhance the adherence of the DLC coating. The formation of a suitable intermediate layer is described in application Ser. Nos. 08/220 234 filed Mar. 9, 1994 and 08/215 468, filed Mar. 18, 1994, now U.S. Pat. No. 5,391,407, both of which are incorporated herein by reference.

Basically, an intermediate silicide layer is formed on a metal substrate in order to form strong interatomic bonds across the DLC coating-substrate interface. In order to knit the successive layers of metal-silicon-DLC together effectively, a bond-interface is provided for the metal-silicon bond as well as for the silicon-DLC bond. A preferred metal substrate will form a strongly-cohesive silicide—that is, an intermetallic compound in which the bonding is partially metallic and partially covalent. Metal substrates that form strongly-cohesive silicides include cobalt, nickel, titanium, zirconium, chromium, molybdenum, tungsten, platinum, and palladium. If the substrate is not metal or a metal alloy, then the deposition process may begin after the workpiece is cleaned.

In the case of a metal or metal alloy substrate, the substrate should be heated, preferably to a temperature of about 300° C. (572° F.), or, if the material is temperature sensitive, to the highest temperature acceptable for that material. Silicon then should be deposited onto the substrate using known means. A preferred means is to position the workpiece directly over a volatilization hearth maintained at a preferred temperature of about 750° C. (1382° F.) until a preferred coating thickness of between 100–200 nm has been achieved. The thickness of the coating may be monitored using standard methods, e.g., using the frequency charge of a quartz crystal oscillator.

At substantially the same time, the metal workpiece should be bombarded with an energetic beam of ions, preferably argon ions, at an energy range between about 500 eV to 100 keV, preferably between about 10–20 keV. Although argon ions are preferred, other suitable ions may be used, such as nitrogen, argon, hydrogen, silicon, methane, helium, neon, xenon, or krypton. The ions should bombard the workpiece at an energy between about 500 eV to 100 keV, preferably 10–30 keV. The ion-to-atom ratio should be sufficient, preferably at least 1 ion to 10 silicon atoms, to form a layer of metal silicide at the metal-silicon interface. The workpiece then should be cooled to about 80° C. (176° F.), preferably without removing the component from the vacuum chamber.

Preferably, the chamber in which the workpiece is cleaned by ion bombardment can also be used as the deposition chamber for condensing the precursor onto the workpiece and bombarding the resulting film with ions. The deposition chamber should be provided with a vaporizer and a pyrolysis chamber. The three chambers should be interconnected so that the vapor liberated by heating the precursor will flow from the vaporizer through the pyrolysis chamber and into the deposition chamber. The apparatus should be adapted to provide each chamber with appropriate pressure and temperature, as discussed more fully below.

A preferable paraxylylene precursor is a cyclic dimer having the following structure:

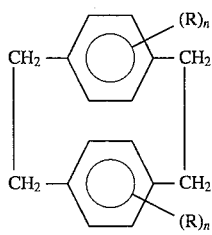

wherein R is hydrogen or up to four halogen substituents. In a preferred embodiment, the cyclic dimer is unsubstituted; however, R may be a halogen, preferably chlorine. If the precursor is halogenated, aliphatic side chains are undesirable because they tend interfere with processing. For example, under the deposition conditions of the present invention, aliphatic side chains tend to form insoluble residues and components which can give rise to halogen gas, such as hydrogen chloride.

One advantage of paraxylylene precursors is that, unlike polyphenyl ether, the paraxylylenes have a pure carbon backbone. No oxygen, nitrogen, or sulfur atoms exist in the backbone, which could require crosslinking to achieve reasonable properties. Because polar entities are absent from their essential makeup, parylenes are hydrophobic.

The paraxylylene precursor should be heated in a vaporizer which has been evacuated to a pressure of at least about $10^{-6}$ torr. A suitable temperature for vaporization is between about 130° C.–220° C. (266°–428° F.), preferably about 200° C. (392° F.). The vapor should be directed into a pyrolysis chamber which preferably comprises a heat resistant glass tube heated to a temperature sufficient to disassociate the dimer into its monomeric form. A suitable temperature for the pyrolysis chamber would be between about 550°–700° C. (1022°–1292° F.), preferably about 680° C. (1256° F.) The pyrolysis chamber or tube should be large enough (or long enough) to heat the vapor as it passes through to a temperature sufficient to substantially disassociate the paraxylylene dimer into its monomeric form. If a heat resistant glass tube is used, a length of about one foot should be sufficient.

The vapor should exit the pyrolysis chamber near the workpiece in the deposition chamber. The deposition chamber may be maintained at ambient temperature and at minimal vacuum pressure, preferably by differential pumping to about $10^{-4}$ to $10^{-5}$ torr. Preferably, the deposition chamber is provided with a source for an ion beam. As the substantially monomeric vapor exits the pyrolysis chamber, the vapor will condense onto the workpiece and spontaneously form a parylene film having a thickness of between about 1–2 microns. The thickness of the film may be measured using standard procedures, e.g., by testing the change in weight of a test disk in the chamber which is and subjected to the same procedures as the workpiece. The polymerization process does not require a catalyst or an elevated temperature cure cycle. As a result, no cure stresses are associated with the polymerization process. Also, the precursor never passes through a liquid phase; therefore, the surface is not subject to the same forces that tend to distort liquids. The resulting parylene film is a thin, even, pinhole free, and continuous.

Once the workpiece is coated with parylene film having a thickness between about 1–2 microns, the workpiece should be bombarded, either in a continuous or interrupted fashion, with an energetic beam of ions to convert the parylene film into a DLC coating. Preferable ions for this bombardment are nitrogen, argon, hydrogen, silicon, methane, helium, or neon. The ion beam should have an energy between about 500 eV to 100 keV, preferably 10–30 keV. The procedure should be continued until a DLC coating having a thickness between about 100 nm–10 microns, preferably 500 nm–1 micron, is achieved.

A person of skill in the art will recognize that many modifications to the foregoing may be made without departing from the spirit and scope of the present invention. The embodiment described herein is meant to be illustrative only and should not be taken as limiting the invention, which is defined in the following claims.

I claim:

1. A method for producing a diamond-like carbon coating on a cleaned workpiece comprising:

evacuating a vaporizing chamber to a pressure of at least about $10^{-6}$ torr;

vaporizing a solid paraxylylene precursor in said chamber at a temperature sufficient to vaporize but insufficient to decompose said precursor;

pyrolyzing said paraxylylene precursor for a time and at a temperature sufficient to disassociate said precursor into substantially monomeric paraxylylene;

condensing said substantially monomeric paraxylylene onto the cleaned workpiece in a chamber evacuated to about $10^{-4}$ to $10^{-5}$ torr, whereby said substantially monomeric paraxylylene polymerizes to form a parylene film;

bombarding said parylene film with ions at energies between about 500 eV to 100 keV to form the diamond-like carbon coating on said workpiece.

2. The method of claim 1 wherein said parylene film is bombarded with ions at an energy between about 10–30 keV.

3. The method of claim 1 wherein said vaporizing step occurs at a temperature between about 130°–250° C.; and said pyrolyzing step occurs at a temperature between about 550°–700° C.

4. The method of claim 2 wherein said vaporizing step occurs at a temperature between about 130°–250° C.; and said pyrolyzing step occurs at a temperature between about 550°–700° C.

5. A method for producing a diamond-like carbon coating on a cleaned workpiece comprising:

evacuating a vaporizing chamber to a pressure of at least about $10^{-6}$ torr;

vaporizing a solid paraxylylene precursor in said chamber at a temperature sufficient to vaporize but insufficient to decompose said precursor;

pyrolyzing said paraxylylene precursor for a time and at a temperature sufficient to disassociate said precursor into substantially monomeric paraxylylene;

condensing said substantially monomeric paraxylylene onto the cleaned workpiece in a chamber evacuated to about $10^{-4}$ to $10^{-5}$ torr whereby said substantially monomeric paraxylylene polymerizes to form a parylene film;

bombarding said parylene film with ions at energies between about 10–30 keV to form the diamond-like carbon coating on said workpiece.

6. The method of claim 1 wherein said vaporizing step occurs at a temperature of about 200° C.; and said pyrolyzing step occurs at a temperature of about 680° C.

7. The method of claim 5 wherein said vaporizing step occurs at a temperature of about 200° C.; and said pyrolyzing step occurs at a temperature of about 680° C.

8. The method of claim 1 wherein said ions are selected from the group consisting of nitrogen, argon, argon, hydrogen, silicon, methane, helium, neon, and combinations thereof.

9. The method of claim 6 wherein said ions are selected from the group consisting of nitrogen, argon, argon, hydrogen, silicon, methane, helium, neon, and combinations thereof.

10. The method of claim 1 wherein said precursor is paraxylylene dimer.

11. The method of claim 2 wherein said precursor is paraxylylene dimer.

12. The method of claim 4 wherein said precursor is paraxylylene dimer.

13. The method of claim 5 wherein said precursor is paraxylylene dimer.

14. The method of claim 7 wherein said precursor is paraxylylene dimer.

15. The method of claim 9 wherein said precursor is paraxylylene dimer.

16. The method of claim 1 wherein said workpiece is comprised of metal and said metal workpiece is pre-treated prior to said evacuating by the steps of:

initially placing said metal workpiece in a vacuum chamber at a pressure of about $10^{-5}$ torr;

heating said metal workpiece to the highest temperature acceptable for said metal;

depositing onto said workpiece a layer of silicon having a thickness sufficient to form a metal-silicide bonding layer;

substantially simultaneously bombarding said workpiece with an energetic beam of ions at an energy between about 500 eV–100 keV; and cooling said workpiece.

17. The method of claim 16 wherein said metal is selected from the group consisting of cobalt, nickel, titanium, zirconium, chromium, molybdenum, tungsten, platinum, palladium, and combinations thereof.

18. The method of claim 17 wherein said workpiece is bombarded with argon ions at about 10 keV energy before said workpiece is heated.

19. The method of claim 18 wherein said metal workpiece is heated to a temperature of about 300° C. before depositing said silicon.

20. The method of claim 19 wherein said metal workpiece is cooled to a temperature of about 80° C. before condensing said diamond-like carbon precursor onto said surface of said workpiece.

21. The method of claim 16 wherein said silicon is deposited on said workpiece to a thickness of between about 100–200 nm.

22. The method of claim 20 wherein said silicon is deposited on said workpiece to a thickness of between about 100–200 nm.

* * * * *